(12) United States Patent
Marsh

(10) Patent No.: US 7,759,187 B2
(45) Date of Patent: *Jul. 20, 2010

(54) METAL PLATING USING SEED FILM

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 697 days.

This patent is subject to a terminal disclaimer.

(21) Appl. No.: 11/602,607

(22) Filed: Nov. 21, 2006

(65) Prior Publication Data

US 2007/0077441 A1 Apr. 5, 2007

Related U.S. Application Data

(63) Continuation of application No. 11/054,018, filed on Feb. 9, 2005, now Pat. No. 7,262,132, which is a continuation of application No. 10/231,435, filed on Aug. 29, 2002, now Pat. No. 6,861,355.

(51) Int. Cl.
*H01L 21/8242* (2006.01)

(52) U.S. Cl. .............................. 438/239; 257/E21.008; 438/650

(58) Field of Classification Search ................ 438/650, 438/652, 685, 584, 620, 622, 239, 243, 386, 438/597, 396; 257/E21.008
See application file for complete search history.

(56) References Cited

U.S. PATENT DOCUMENTS

| | | | |
|---|---|---|---|
| 6,294,425 B1 | 9/2001 | Hideki | |
| 6,344,126 B1 | 2/2002 | Moore | |
| 6,355,561 B1 | 3/2002 | Sandhu et al. | |
| 6,368,954 B1 | 4/2002 | Lopatin et al. | |
| 6,383,865 B2 | 5/2002 | Hong et al. | |
| 6,391,785 B1 | 5/2002 | Satta et al. | |
| 6,420,230 B1 | 7/2002 | Derderian et al. | |
| 6,461,436 B1 | 10/2002 | Campbell et al. | |
| 6,461,909 B1 | 10/2002 | Marsh et al. | |
| 6,462,367 B2 | 10/2002 | Marsh et al. | |
| 6,482,740 B2 | 11/2002 | Soininen et al. | |
| 6,534,395 B2 | 3/2003 | Werkhoven et al. | |
| 6,630,387 B2 | 10/2003 | Horii | |
| 6,656,835 B2 | 12/2003 | Marsh et al. | |
| 6,709,989 B2 | 3/2004 | Ramdani et al. | |
| 6,830,983 B2 | 12/2004 | Marsh | |

(Continued)

OTHER PUBLICATIONS

U.S. Appl. No. 11/602,623, filed Nov. 21, 2006, Marsh.

(Continued)

*Primary Examiner*—Savitri Mulpuri
(74) *Attorney, Agent, or Firm*—Wells St. John P.S.

(57) ABSTRACT

A seed film and methods incorporating the seed film in semiconductor applications is provided. The seed film includes one or more noble metal layers, where each layer of the one or more noble metal layers is no greater than a monolayer. The seed film also includes either one or more conductive metal oxide layers or one or more silicon oxide layers, where either layer is no greater than a monolayer. The seed film can be used in plating, including electroplating, conductive layers, over at least a portion of the seed film. Conductive layers formed with the seed film can be used in fabricating an integrated circuit, including fabricating capacitor structures in the integrated circuit.

25 Claims, 5 Drawing Sheets

U.S. PATENT DOCUMENTS

| | | | |
|---|---|---|---|
| 6,849,122 | B1 | 2/2005 | Fair |
| 6,861,355 | B2 | 3/2005 | Marsh |
| 7,189,611 | B2 | 3/2007 | Marsh |
| 2001/0041250 | A1* | 11/2001 | Werkhoven et al. ......... 428/212 |
| 2002/0004293 | A1* | 1/2002 | Soininen et al. ............. 438/584 |
| 2002/0167089 | A1 | 11/2002 | Ahn et al. |
| 2003/0008243 | A1 | 1/2003 | Ahn et al. |
| 2005/0020060 | A1* | 1/2005 | Aaltonen et al. ............ 438/650 |
| 2005/0170645 | A1 | 8/2005 | Marsh |

OTHER PUBLICATIONS

Bardi, Ugo, *Atomic Layer Epitaxy Network*, "Atomic Layer Epitaxy," [online]. University of Firenze, Italy; [Retrieved on Jul. 9, 2002]. Retrieved from the Internet: <URL:http//www.alenet.unifi.it/intro.htm>; 5 pgs.

Chang, Ci Shih, "Applications of Metal-Insulator-Metal (MIM) Capacitors," *International Sematech*, Aug. 31, 2000; Technology Transfer # 00083985A-ENG: 20 pgs.

Kawamoto et al., "The Outlook for Semiconductor Processes and Manufacturing Technologies in the 0.1-μm Age," *Hitachi Review*, 1999;48(6): 334-339.

Vehkamäki et al., "Growth of $SrTiO_3$ and $BaTiO_3$ Thin Films by Atomic Layer Depostion," *Electrochemical and Solid-State Letters*; 1999;2(10):504-506.

\* cited by examiner

METAL PLATING USING SEED FILM

This is a continuation of application Ser. No. 11/054,018, filed Feb. 9, 2005, (pending), which is a continuation of application Ser. No. 10/231,435, filed Aug. 29, 2002, issued as U.S. Pat. No. 6,861,355 on Mar. 1, 2005, which are all incorporated herein by reference.

TECHNICAL FIELD

The invention relates to fabrication of integrated circuits and, more particularly, to plating of metal layers using seed films in integrated circuit fabrication.

BACKGROUND

Formation of conductive materials is an important fabrication process in integrated circuit (IC) production. Thin conductive films are used in creating any number of IC structures. Examples of these structures include, for example, interconnects, capacitor electrodes (e.g., metal-insulator-metal (MIM) electrodes), etc.

The requirements of a conductive material formation process can be demanding. In many cases, for example, conductive films need to be deposited at reasonably low temperatures tolerated by other materials used in integrated circuits. In addition, for example, the conductive films need to be high quality conformal films formed over a substrate surface, e.g., openings, deep trenches, container capacitor openings, etc. Furthermore, such films need to be formed with high throughput.

Various processes can be used to form such films. For example, physical processes (e.g., physical vapor deposition (PVD), evaporation, sputtering) or chemical processes (e.g., chemical vapor deposition (CVD) or plating) may be used. In addition, electroplating has been advantageously used in forming conductive and conformal films at high throughput.

In the electroplating process, a seed film can be initially applied to IC structures during processing. The seed film can then be used as a conductive surface on which the electroplating process can then take place. The seed films are typically formed by either the physical or chemical film forming process mentioned above. Typical processes for forming seed films used in electroplating conductive films, however, have various disadvantages. For example, seed films produced by either CVD or PVD in many circumstances require an overabundance of seed film to be deposited to ensure film continuity. The result of this overabundance is that certain areas of the seed film have thicker deposits as compared to other areas. This is especially true for high aspect ratio structures, such as openings or trenches (e.g., container capacitor openings), which typically require a thick deposit in order to yield sufficient seed layer on the side of the walls of the structure for successful plating therein. Further, for example, adhesion of an electroplated layer to seed films deposited by PVD may only be marginal.

In a specific example, electroplated platinum is an attractive candidate for a bottom MIM electrode because of the high quality conformal films that can be deposited at high throughput. The typical PVD platinum seed layer, however, could be improved since it requires a thick deposit in order to yield sufficient platinum on the sidewalls of the container for successful plating. Also, adhesion is only marginal with the PVD platinum seed layer.

Thus, a need exists for creating uniform seed films for use in the electroplating process.

SUMMARY OF THE INVENTION

In view of the foregoing, there is a need in the semiconductor art for creating uniform seed films for use in electroplating processes. Accordingly, the present invention is directed to an electroplating method for use in fabricating an integrated circuit, a method for plating, a method for use in fabricating a capacitor, a seed film for use in electroplating a conductive layer, and a capacitor for an integrated circuit.

One aspect of the present invention provides a plating method, including an electroplating method, where the plating method can be used in fabricating an integrated circuit. Preferably, the method includes forming a seed film on at least a portion of a surface of a substrate assembly by atomic layer deposition, where the seed film comprises at least a noble metal and a conductive metal oxide, and plating a conductive layer over at least a portion of the seed film.

The method may also include repeating one or more deposition cycles in forming the seed film, where at least one of the one or more deposition cycles includes providing a predetermined amount of one or more noble metal containing precursors, and providing a reactant for use in converting at least one of the one or more noble metal precursors to less than a monolayer of at least one noble metal of the one or more noble metal containing precursors. The method may also include oxidizing at least a portion of the monolayer of the at least one noble metal.

Preferably, the conductive metal oxide is at least one noble metal oxide selected from a group consisting of iridium oxide, ruthenium oxide, and rhodium oxide. In addition, the at least one noble metal of the present invention comprises at least one noble metal selected from a group consisting of iridium, ruthenium, platinum, and rhodium.

According to one aspect of the present invention, plating a conductive layer comprises forming at least a portion of an electrode of a capacitor structure using the seed film. Preferably, plating the conductive layer over the seed film includes chemical vapor depositing conductive material over at least a portion of the seed film, and plating the conductive layer over the conductive material and the seed film. In one embodiment, plating the conductive layer comprises electroplating a conductive layer comprising platinum over at least a portion of the seed film.

The present invention also includes an additional plating method, including an electroplating method for use in fabricating an integrated circuit. Preferably, the plating method includes forming a seed film on at least a portion of a surface of a substrate assembly by atomic layer deposition, where the seed film comprises at least a noble metal, as discussed, and an oxide material, and plating a conductive layer over at least a portion of the seed film.

The method may also include repeating one or more deposition cycles in forming the seed film, where at least one of the one or more deposition cycles includes providing a predetermined amount of one or more noble metal containing precursors, and providing a reactant for use in converting at least one of the one or more noble metal precursors to less than a monolayer of at least one noble metal of the one or more noble metal containing precursors. In addition, forming the seed film can include repeating one or more deposition cycles, where at least one of the one or more deposition cycles includes providing a Si containing precursor, and providing a reactant for use in converting at least a portion of the Si containing precursor to less than a monolayer of silicon oxide.

According to one aspect of the present invention, plating a conductive layer includes forming at least a portion of an electrode of a capacitor structure using the seed film. Preferably, plating the conductive layer over the seed film includes chemical vapor depositing conductive material over at least a portion of the seed film, and electroplating the conductive layer over the conductive material and the seed film. In one embodiment, plating the conductive layer comprises electroplating a conductive layer comprising platinum over at least a portion of the seed film.

An additional aspect of the present invention includes a method for use in fabricating a capacitor, including a capacitor for an integrated circuit. Preferably, the capacitor includes a substrate assembly, a bottom electrode over at least a portion of the substrate assembly, a dielectric layer on the bottom electrode, and a top electrode on the dielectric layer. Preferably, at least one of the bottom electrode and the top electrode comprise an ALD deposited seed film comprising one or more noble metal layers, as described, and one or more conductive metal oxide layers, as described, where each of the one or more noble metal layers and one or more conductive metal oxide layers is no greater than a monolayer, and further where the at least one of the bottom electrode and the top electrode comprises at least one conductive layer formed on the seed layer.

In an alternative embodiment, the at least one of the bottom electrode and the top electrode comprise an ALD deposited seed film positioned between integrated circuit substrate assembly and the top electrode, where the conformal seed film comprises one or more noble metal layers, as described, and one or more oxide material layers, as described, where each of the one or more noble metal layers and one or more oxide material layers is no greater than a monolayer, and further where the at least one of the bottom electrode and the top electrode comprises at least one conductive layer formed as the seed layer.

In one preferred embodiment, the conformal seed film is between a surface of the substrate assembly and the bottom electrode. In an alternative preferred embodiment, the capacitor further includes a second conformal seed film, where the second conformal seed film is between the dielectric layer and the top electrode.

Fabricating the capacitor includes forming a bottom electrode, forming a dielectric layer on the bottom electrode, and forming a top electrode on the dielectric layer. In one example, forming at least one of the bottom electrode and top electrode includes forming a seed film comprising one or more noble metal layers and one or more conductive metal oxide layers by atomic layer deposition, where each of the one or more noble metal layers and conductive metal oxide layers is not greater than a monolayer, and plating at least one electrode material on at least a portion of the seed film. Preferably, the bottom electrode can be formed using the seed film.

In an additional example, forming at least one of the bottom electrode and top electrode includes forming a seed film comprising one or more noble metal layers and one or more oxide material layers by atomic layer deposition, where each of the one or more noble metal layers and oxide material layers is not greater than a monolayer, and plating at least one electrode material on at least a portion of the seed film. Preferably, the bottom electrode can be formed using the seed film.

An additional aspect of the present invention provides a seed film for use in electroplating a conductive layer. The seed film can include one or more noble metal layers, as described, where each layer of the one or more noble metal layers is no greater than a monolayer. In one embodiment, the seed film also includes one or more conductive metal oxide layers, as described, where each layer of the one or more conductive metal oxide layers is no greater than a monolayer. In an alternatively embodiment, the seed film includes one or more silicon oxide layers, as described, where each layer of the one or more silicon oxide layers is no greater than a monolayer.

According to one aspect of the present invention, the seed film includes alternating layers of the one or more noble metal layers and the one or more conductive metal oxide layers. Alternatively, the seed film includes alternating layers of the one or more noble metal layers and the one or more silicon oxide layers. In one preferred embodiment, the one or more noble metal layers comprise platinum and the one or more conductive metal oxide layers comprise rhodium oxide. In an additional preferred embodiment, the first series of noble metal layers are platinum, and the second series of silicon oxide layers are silicon dioxide.

Preferably, the seed film for use in electroplating a conductive layer of the present invention includes one or more platinum layers, where each layer of the one or more platinum layers is no greater than a monolayer, and one or more rhodium oxide layers, where each layer of the one or more of rhodium oxide layers is no greater than a monolayer. In an additional preferred aspect of the present invention, the seed film further includes alternating layers of the one or more platinum layers and the one or more rhodium oxide layers.

In an additional preferred embodiment, the seed film for use in electroplating a conductive layer includes one or more platinum layers, where each layer of the one or more platinum layers is no greater than a monolayer, and one or more silicon dioxide layers, where each layer of the one or more silicon dioxide layers is no greater than a monolayer. Preferably, the seed film can further include alternating layers of the one or more platinum layers and the one or more silicon dioxide layers.

These and other features and advantages of the present invention will be apparent from the following description of various embodiments and as illustrated in the accompanying figures.

DETAILED DESCRIPTION

Generally, the present invention provides seed films for electroplating processes and methods of using the seed films in electroplating conductive material, e.g., platinum, on a substrate assembly. In addition, the present invention provides for electrode and capacitor structures formed on substrate assemblies through the use of the seed films and electroplating methods of the present invention. Other methods and structures are also presented.

The present invention can be especially useful in providing seed films on surfaces of substrate assemblies that have high aspect ratios. High aspect ratio structures include those having an aspect ratio of greater than about 1:1. This includes structures that have aspect ratios that are 10:1 or even larger. In addition, the high aspect ratio structures may generally include critical dimensions that are less than 1 micron. In addition to high aspect ratio structures, the present invention can be useful in providing uniform seed films over any number of IC substrate structures that have traditionally been difficult to provide with a uniform seed film. Examples of such structures include, but are not limited to, trenches, container capacitor openings, interconnect openings such as a damascene structure, contacts, and vias.

The present invention provides seed films and methods of forming seed films for use in plating conductive layers. For example, the seed films of the present invention can be used in electroplating of platinum and/or platinum alloy layers. Specifically, the present invention is directed to the use of atomic layer deposition (ALD) in forming seed films on at least a portion of a surface of a substrate assembly. ALD can be used to form seed films that conform to substrate surfaces, even those surfaces that define high aspect ratios. The seed films formed by ALD according to the present invention can then be used in electroplating a conductive material on the seed film.

As used in this application, "substrate assembly" refers to either a semiconductor substrate such as the base semiconductor layer, e.g., the lowest layer of silicon material in a wafer, or a silicon layer deposited on another material such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc.

Figure 1:
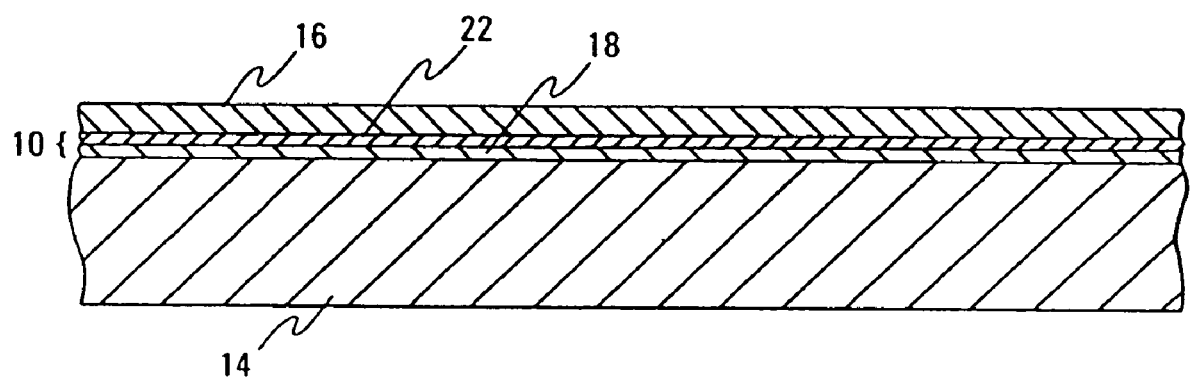
FIG. 1 is a cross-sectional view of one embodiment of a substrate assembly having a seed film formed thereon according to the present invention.

FIG. 1 provides a general example of a seed film 10 on a substrate assembly 14 for use in electroplating a conductive layer 16 thereon according to the present invention. The seed film 10 preferably includes multiple layers (e.g., one or more atomic or molecular layers) of metal and metal containing material in any number of layering configurations. For example, the seed film 10 preferably includes a seed film formed by ALD. Preferably, the seed film 10 formed by ALD may be any film built progressively by adding atomic or molecular layers one after another until a desired thickness is achieved. An atomic or molecular layer may be any layer less than a monolayer.

In one particular illustrative example, an alternating series of layers can form the seed film 10. The alternating series of layers may include two or more series of layers. For example, the alternating series of layers may include a first series of layers 18 formed by ALD (e.g., rhodium oxide layers) and a second series of layers 22 formed by ALD (e.g., platinum layers). In an additional example, forming the first series of layers 18 and the second series of layers 22 can be progressively repeated (e.g., forming the first series of layers 18, followed by the second series of layers 22, followed by the first series of layers, followed by the second series 22 of layers, etc.) until a desired thickness of the seed film 10 is achieved.

The series of layers 18 and 22 can each have any number of ALD formed atomic layers (e.g., one or more layers). The exact number of layers for each series may be dependent upon the type of metal and/or compounds that are being deposited.

In addition, the exact number of layers for each series may depend on the desired thickness for the seed film. In general, the seed film may be formed by, for example, any number of layers, series of layers, alternating series of layers, as long as the seed film is formed at least in part by progressively adding atomic or molecular layers one after the other until a desired thickness is achieved.

In one example, the seed film 10 preferably includes one or more layers formed of one or more noble metals (e.g., the first series of layers 18) and one or more layers formed of conductive metal oxides (e.g., the second series of layers 22). For example, the one or more layers may be formed of a noble metal or alloys of noble metals. As used herein, noble metals include, but are not limited to, platinum, ruthenium, rhodium, and iridium. Other noble metals may also include palladium, and osmium. The one or more layers of conductive metal oxide may be formed of noble metal oxide. Examples of the conductive metal oxide layers include, but are not limited to, ruthenium oxide, rhodium oxide, osmium oxide, and iridium oxide.

In an additional illustrative example, the seed film 10 preferably is a noble metal doped oxide that includes one or more layers formed of one or more noble metals (e.g., the first series of layers 18) and one or more layers formed of an oxide material (e.g., the second series of layers 22). For example, the one or more layers may be formed of a noble metal or alloys of noble metals. Examples of noble metals are as previously discussed. The one or more layers of the oxide material may be formed of any number of dielectric materials and or non-conductive oxide materials as long as the film is still conductive. Examples of the oxide material include, but are not limited to, silicon oxide ($SiO_x$), silicon dioxide ($SiO_2$), $Si_3N_4$, and $Al_2O_3$. One example of a seed film 10 that includes an oxide doped noble metal is a silicon oxide doped platinum seed film 10.

The seed film 10 can be formed by ALD. Layers, less than a monolayer, are deposited during cycles of ALD to form the seed film 10 of the present invention. For example, each cycle of ALD may form at least one layer of a series of the layers 18 and 22. Preferably, in each of the one or more ALD cycles, as is generally known, a predetermined amount of one or more precursors is provided on the surface upon which the layer is to be formed. The precursor is then converted, (e.g., by oxygen or other reactant) to the desired atomic layer after purging the process chamber. As ALD is a self-limiting process with use of a predeposited amount of precursor prior to conversion, each layer is typically controlled to be no greater than a monolayer. The purging of the chamber typically completes a cycle and future cycles are used for progressively building material on the previously deposited layer so as to form a very conformal film.

Examples of noble metal containing precursors used to form noble metal layers or the conductive metal oxide layers may include one or more noble metal containing precursors (e.g., organometalic precursors) such as iridium, ruthenium, platinum, and rhodium containing precursors. Specific examples of these precursors include, but are not limited to, $MeCpPt(Me)_3$, $CpRh(CO)_2$, $CpRu(CO)_3$, and $Cpir(CO)_2$, where Cp is cyclopentadienyl. Preferably, the noble metal containing precursor is a platinum containing precursor such as $MeCpPt(Me)_3$, $CpPt(Me)_3$, $Pt(acetylacetonate)_2$, $Pt(PF_3)_4$, $Pt(CO)_2Cl_2$, cis-$[PtMe_2(MeNC)_2]$, or platinum hexafluoroacetylacetonate.

Reactants used for converting at least one of the one or more noble metal containing precursors may include any number of suitable reactants. For example, the reactants can include, but are not limited to, oxygen such as for forming platinum or rhodium layers; ozone, such as for forming platinum and also possibly reacting with previously formed rhodium to form rhodium oxide; $N_2O$, or $SO_3$.

In addition to converting the noble metal precursors, any number of suitable reactants may also be used in an oxidative process to produce conductive metal oxides. For example, the reactants can include ozone that can both provide for the effective formation of a platinum layer from a platinum containing precursor and cause the oxidation of a previously formed layer of rhodium to form rhodium oxide. Other suitable reactants may include $O_2$, $N_2O$, and $SO_3$. Use of one or more of these reactants can be used in forming other conductive metal oxide layers from previously formed metal layers. For example, $O_2$ can be used in forming iridium oxide from a previously formed layer of iridium.

Examples of oxide material (e.g., non-conductive oxide material) precursors used to form oxide material layers may include one or more silicon containing precursors such as disilane ($Si_2H_6$), $SiH_4$, or $SiR_xH_y$, where R can be either an organic group or a halide.

As discussed, the seed film 10 can include any number of multiple layers of metal and metal compounds (e.g., conductive metal oxides) in any number of layering configurations. In a preferred embodiment, the seed film 10 includes alternating series of noble metal and conductive metal oxide layers. In a preferred embodiment, the seed film 10 includes one or more noble metal layers of platinum and one or more conductive metal oxide layers of rhodium oxide.

In an additionally preferred embodiment, the seed film 10 includes alternating series of noble metal and oxide material layers. In a preferred embodiment, the seed film 10 includes one or more noble metal layers of platinum and one or more oxide material layers of silicon oxide ($SiO_x$).

In the above examples, the seed film 10 includes an oxide compound. For example, the seed film 10 can include iridium oxide, ruthenium oxide, rhodium oxide, and/or $SiO_x$. Seed films of the present invention that include at least one of the oxide compounds have been found to display superior adhesion characteristics with respect to the seed films adhesion to the underlying substrate and to the conductive layer electroplated onto the seed film.

It will be appreciated that the number and order of the seed film layers is dependent, at least, upon the type of metal and/or compounds that are being deposited. In addition, the thickness of the seed film 10 can vary depending on the number and thickness of the ALD deposited layers. Preferably, the seed film 10 has a thickness of no less than 20 angstroms. In addition, the seed film 10 preferably has a thickness of no greater than about 500 angstroms. In addition, preferably, the seed film 10 has a thickness of no less than 20 angstroms and no greater than about 500 angstroms.

As discussed, the seed film 10 is a conductive layer that is used in a plating process according to the present invention. For example, the plating process can include electroplating a conductive material on at least a portion of the substrate assembly 14. During electroplating, the seed film 10 is used as at least a portion of an electrode (e.g., cathode) in the conductive material plating process. The result of the electroplating process is a conductive layer that includes both the seed film 10 and the conductive layer 16 deposited by electroplating.

Figure 2:
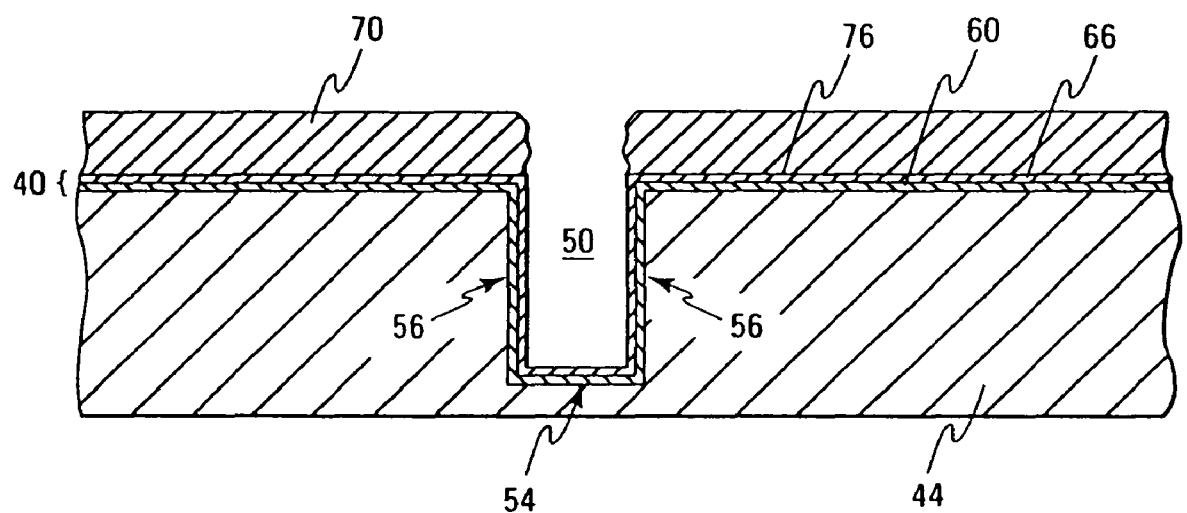
FIG. 2 is a cross-sectional view of another embodiment of a substrate assembly having a seed film and an optional conductive film formed thereon according to the present invention.

FIG. 2 shows an illustrative embodiment of a seed film 40 of the present invention on an IC substrate assembly 44. The IC substrate assembly 44 defines an opening 50 having a high aspect ratio. In one example, the high aspect ratio is at least a 1:1 aspect ratio and has critical dimensions of less than 1 micron.

The opening 50 includes a bottom 54 and sidewalls 56 extending therefrom. The seed film 40 shows a first series of layers 60 and a second series of layers 66 deposited by ALD. As previously mentioned, any number of cycles of an ALD process may be used to deposit layers to form the seed film 40. In addition, any technique that progressively builds layers of less than a monolayer can be used in forming the seed film. Preferably, the techniques of ALD and/or atomic layer epitaxy can be used to progressively build layers of less than a monolayer so as to form the seed film.

The seed film 40 is shown as being conformal over the bottom 54 and sidewalls 56 of the substrate assembly 44. The seed film 40 can include any seed film formed as described in the present application. The ALD process provides a conformal seed film 40 that allows for an essentially uniform thickness thereof along the contours of the substrate assembly 44, particularly in the high aspect ratio opening 50.

In addition to being conformal, the seed film 40 deposited by ALD is also more continuous than those produced by either CVD or PVD processes. The more conformal and continuous characteristics of the seed film 40 resulting from the ALD process provide an advantage over films deposited by either CVD or PVD. These advantages include, but are not limited to, electroplated films being formed that have a more uniform thickness resulting from a more uniform current density provided over the entire ALD seed film during the electroplating process as compared to the results from the CVD or PVD seed layers.

As discussed above, the seed film 40 preferably has a thickness of no less than 20 Angstroms and no greater than about 500 Angstroms. This range of seed film thickness may be, in certain cases, unable to support sufficient conductivity across a wafer being processed for an effective electroplating process. As such, the present invention may optionally provide a conductive film 70 on the upper surface 76 of the seed layer 40. This conductive film 70 is of sufficient thickness to provide an effective cathode in the electroplating process.

In one example, the conductive film 70 can be formed on at least a portion of the seed film 40 by a chemical vapor deposition (CVD) process, although other processes may be used. The conductive film 70 is preferably formed on at least the upper surface 76 of the substrate assembly 44 by CVD, but not necessarily on the sidewalls 56 or the bottom 54 of the structure 50. Preferentially, applying the conductive film 70 to the upper surface 76 by CVD can be accomplished by adjusting reaction pressures of the CVD process in such a way that coverage is effected on the upper surface 76, but not necessarily in the opening 50 (e.g., essentially none of the material deposited by CVD enters the opening 50, but only deposits on the upper surface 76 of the seed layer 40 on substrate assembly 44).

The conductive film 70 can be formed from any number of conductive materials that can be deposited by the CVD process. For example, the conductive film 70 can be formed from a noble metal such as platinum. Forming the conductive film 70 from other noble metals is also possible.

In one embodiment, the CVD process can be used to form a conductive film 70 of at least 100 Angstroms over the upper surface 76 of the seed film 40. Alternatively, the CVD process can be used to form the conductive film 70 of no greater than 300 Angstroms over the upper surface 76 of the seed film 40.

The conductive film 70 and the seed film 40 can then be used in an electroplating process. Electroplating using the conductive film 70 and the seed film 40 can be accomplished through any variety of electroplating techniques. For example, an electroplating process is described in U.S. Pat. No. 6,344,126 to Moore, which is incorporated herein by reference in its entirety.

Figure 3:
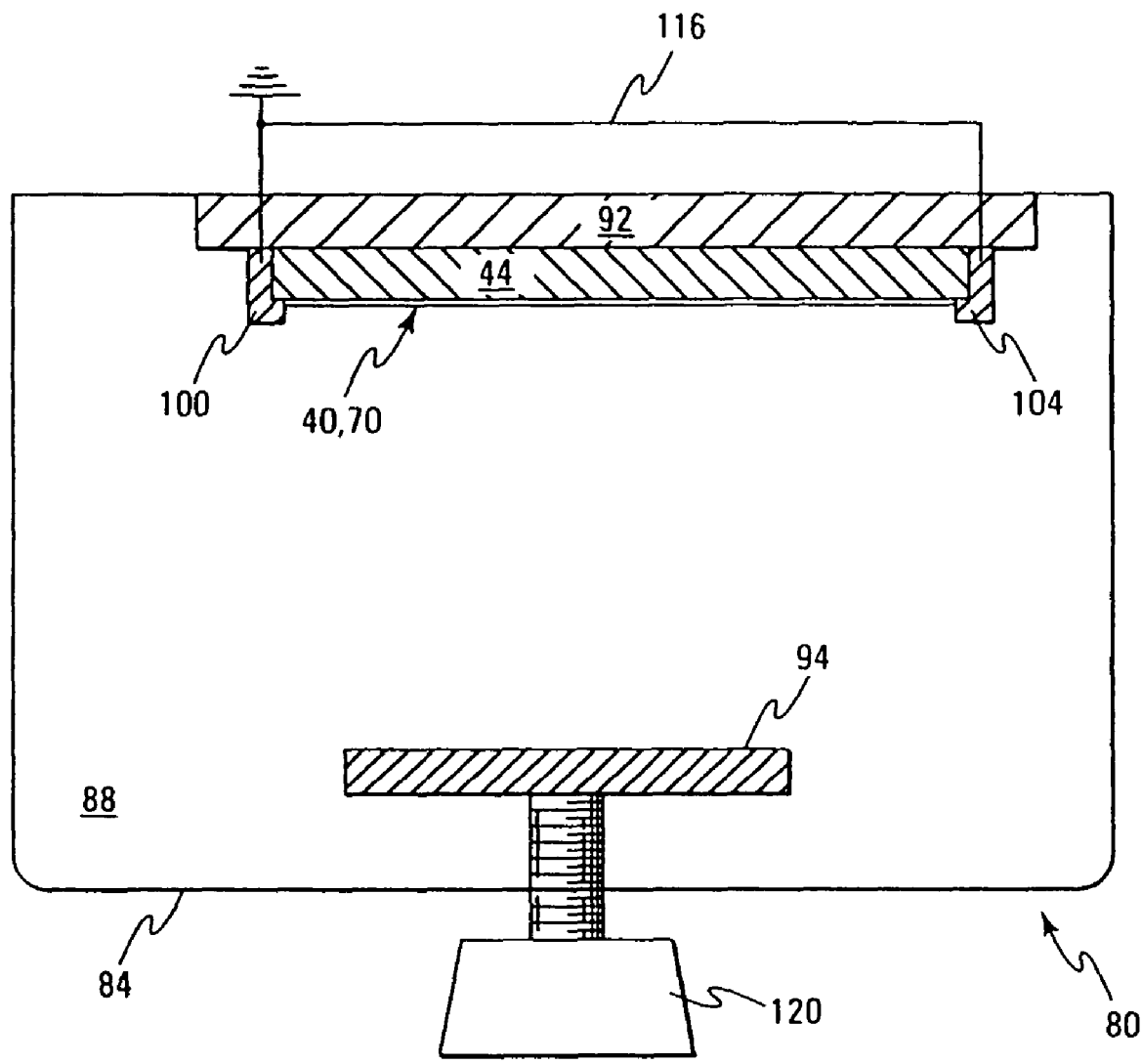
FIG. 3 is a cross-sectional view of a generalized electroplating apparatus according to one embodiment of the present invention.

FIG. 3 illustrates one general example of an electroplating apparatus 80 for use in electroplating over the conductive film 70 and the seed film 40. The apparatus 80 includes a tank 84 containing electroplating solution 88, a support 92 for supporting substrate assembly 44 in the solution 88, and a target (anode) 94 containing conductive material (e.g., platinum, platinum alloy, etc.). The wafer support 92 may have metal clips 100 and 104 for holding the substrate assembly 44 in the desired position. The seed film 40 and the conductive film 70 can be electrically connected through the clips 100 and 104 and suitable wire elements 116.

In operation, a voltage is applied to the target 94 by a control device 120. The electrical potential between the cathode (e.g., seed layer 40/conductive layer 70) and the anode (e.g., the target 94 containing conductive material) causes current to flow from the target 94, through the solution 88, through the conductive film 70 and the seed film 40, and through the clips 100 and 104 to the wire elements 116. The electroplating process causes a migration of conductive material from the target 94 to the cathode for formation of an electroplated conductive layer 130 (FIG. 4) on the conductive film 70 and the seed film 40. The process may be continued until the electroplated conductive layer 130 achieves the desired thickness. The electroplated substrate assembly 44 may then be removed from the tank 84 for further processing.

With respect to the electroplating process of the present invention, any number of conductive materials can be used in forming structures on the substrate assembly. In addition, any number of layers (e.g., one or more) can be formed with the electroplating process in one or more processes in one or more electroplating chambers. Examples of conductive materials for plating on the substrate assembly include, but are not limited to, noble metals, alloys of noble metals, or combinations thereof. Preferably, the noble metal is platinum or an alloy thereof. Additional metals can also be used as plating materials. These metals include, but are not limited to, nickel and/or nickel compounds, copper and/or copper compounds, or combinations thereof.

Figure 4:
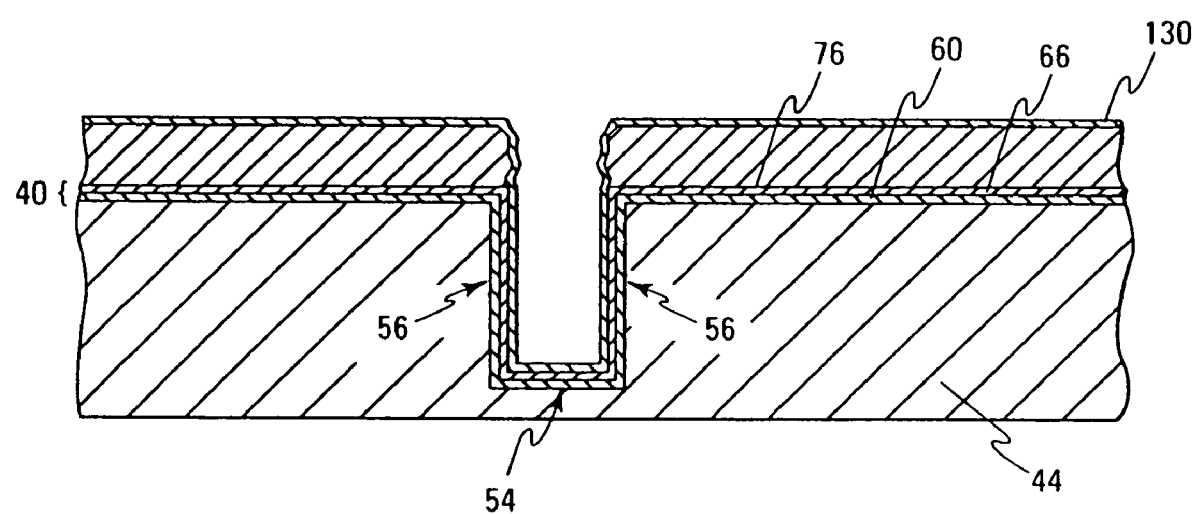
FIG. 4 is a cross-sectional view of a conductive layer plated on the seed layer formed on a substrate assembly as shown in FIG. 2.

FIG. 4 provides an illustration of conductive layer 130 formed by an electroplating process. The present invention is not limited to any particular electroplating process, but only to use of the seed film described herein in any plating process.

The conductive layer 130 formed using the seed film 40 of the present invention can be used in any number of structures on the substrate assembly 44. For example, the conductive layer 130 formed according to the present invention can be used in fabricating electrodes, such as those used in container or trench capacitors, on the substrate assembly 44. The conductive layer 130 can also be used in forming other structures, such as interconnects, contacts, or vias.

Figure 5:
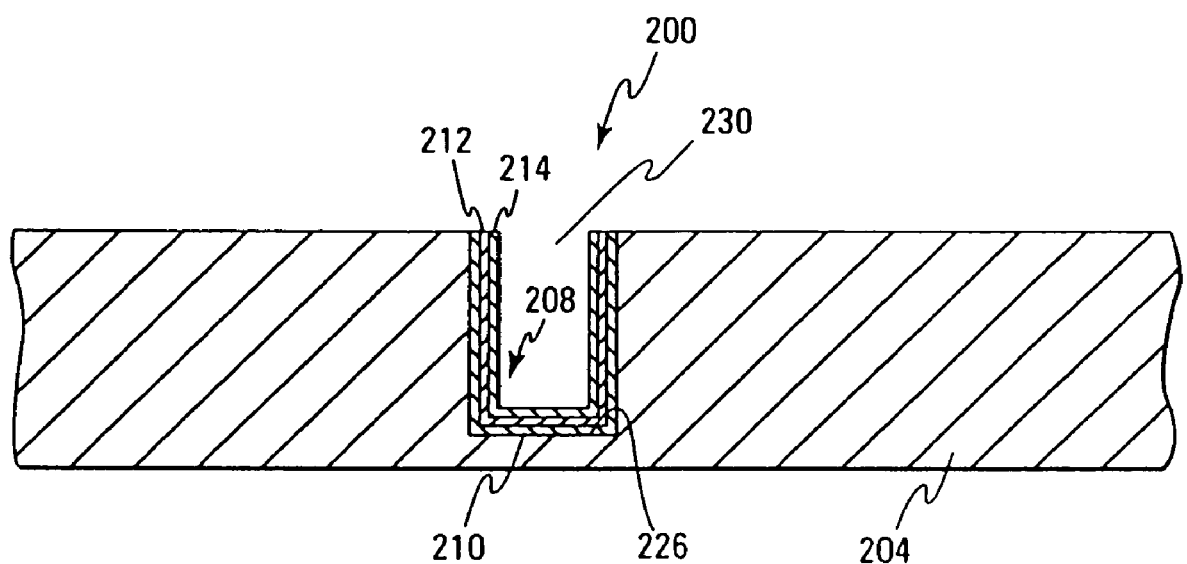
FIG. 5 is a cross-sectional view of a capacitor structure incorporating an electrode formed by electroplating using a seed film according to the present invention.

FIG. 5 shows one example of a capacitor structure 208 formed using a seed film according to the present invention. In the present example, the capacitor 208 includes a bottom electrode 210, a dielectric layer 212 and a top electrode 214. Generally, the capacitor 208 includes at least one electrode (either the bottom electrode 210, the top electrode 214, or both) that is formed using at least a seed film (not shown). One skilled in the art will recognize that the electrodes may be formed using more than one conductive layer and/or multiple materials. Examples of materials used in forming the conductive layers include those discussed in the present application (e.g., platinum, ruthenium, rhodium, etc.). Additional conductive layers can also be deposited in forming the electrodes of the present invention. The additional structures necessary for the operation of the capacitor 208 are not shown.

Generally, the seed film of the present invention can be used to form any one, or both, the bottom electrode 210 and/or the top electrode 214 of the capacitor 208. When the seed film is used in forming the bottom electrode 210, the seed film can be formed over the surface 226 that forms an opening 230 in the substrate assembly 204. A conductive film, as previously discussed, can be deposited on the substrate assembly 204 for use in the electroplating process. The bottom electrode 210 can then be electroplated as described herein (like that of 70) over the seed film in the opening 230. In addition, the seed film can optionally be formed over the dielectric layer 212 and used in plating a conductive layer of the top electrode 214.

The electrodes 210 and 214 of the present invention can be formed from a variety of conductive materials that can undergo the electroplating process, and may also include layers deposited using other processes (e.g., CVD). For example, a noble metal can be electroplated over the seed film in forming one or both of the electrodes 210 and 214. Preferably, the electroplated portion of the electrode is formed of platinum or a platinum alloy. Other electrodes could be formed by electroplating using any number of metals and/or metal alloys, including, but not limited to, copper, nickel, ruthenium, rhodium, and alloys thereof.

The present invention is further illustrated by the following examples, but the particular materials and amounts thereof recited in these examples, as well as other conditions and details, should not be construed to unduly limit this invention.

EXAMPLES

Example 1

Process for ALD Formed Pt—$RhO_x$ Seed Film

ALD was carried out using an experimental test reactor (custom manufacture) operating under high vacuum. All seed films were deposited on BPSG surfaces. Seed films were deposited on the BPSG surfaces at a wafer surface temperature of about 100 degrees to about 112 degrees Celsius.

The Pt—$RhO_x$ seed film of the present example includes multiple series of layers of rhodium and multiple series of layers of platinum, both of which are deposited by ALD. Generally, in a rhodium forming cycle, the BPSG surface was exposed to a 5 second dose of $CpRh(CO)_2$ so as to cover the BPSG surface. The ALD chamber was then purged with 50 SCCM of helium for 5 seconds. The rhodium precursor was then exposed to 50 SCCM of oxygen ($O_2$) for 5 seconds. The resulting rhodium layer had less than a monolayer of coverage. A vacuum was then applied to the ALD chamber for 5 seconds. This complete rhodium formation cycle was repeated for a total of ten (10) times to form the series of rhodium layers.

In a platinum formation portion of the process, the series of platinum layers were then applied over the ALD formed rhodium. Generally, in a platinum formation cycle, the BPSG surface having rhodium formed thereon was exposed to a 5 second dose of $MeCpPt(Me)_3$ at room temperature from a bubbler. The ALD chamber was then purged with 50 SCCM of helium for 5 seconds. The platinum precursor and rhodium formed on the BPSG surface were then exposed to 100 SCCM of ozone ($O_3$) for 5 seconds. The ozone is used to convert the platinum precursor to produce a layer of platinum of less than a monolayer, along with oxidizing the rhodium to produce $RhO_x$. A vacuum was then applied to the ALD chamber for 5 seconds. This complete platinum formation cycle was repeated for a total of ten (10) times to form the series of platinum layers.

The protocol of depositing the rhodium layer series and the platinum layer series was repeated five times, so as to have a total of 100 cycles for both the rhodium precursor and the platinum precursor. The resulting seed film includes a sandwich like structure of platinum and rhodium oxide, e.g., similar to a metal laminate, having a thickness from about 50 to about 150 Angstroms.

Platinum was then plated onto the resulting Pt—RhOx seed film. Electroplating was carried out using a direct current supply operating at approximately 0.01 A to approximately 0.08 A. A platinum plating mixture included $H_2Pt(OH)_6$ at a concentration sufficient to provide 12 grams of platinum per one liter of platinum plating solution. The pH of the platinum plating mixture was adjusted to approximately 11 with KOH.

The resulting electroplated Pt layer and Pt—$RhO_x$ seed film was then subject to a standard peel test. Scratches in a crosshatch pattern were first made in the electroplated Pt layer and Pt—$RhO_x$ seed film, where the scratches extended through both the electroplated Pt layer and the Pt—$RhO_x$ seed film. SCOTCH tape was then applied to the electroplated Pt layer and removed. Neither the electroplated Pt layer, nor the Pt—$RhO_x$ seed film, were removed from the BPSG substrate by the SCOTCH tape.

In addition to the standard peel test, the Pt—$RhO_x$ seed film was subject to a photoresist develop test. The Pt—$RhO_x$ seed film was immersed in positive photoresist developer at room temperature for 30 minutes. The Pt—$RhO_x$ seed film was then rinsed and examined. Visual inspection indicated that the Pt—$RhO_x$ seed film was not removed by exposure to the positive photoresist developer or as a result of the standard peel test.

Example 2

Process for ALD Formed Platinum Doped Silicon Oxide (Pt—$SiO_x$) Seed Film

ALD was carried out using the experimental test reactor (custom manufacture) operating under high vacuum. All seed films were deposited on BPSG surfaces. Seed films were deposited on the BPSG surfaces at a wafer surface temperature of about 235 degrees Celsius.

The Pt—$SiO_x$ seed film of the present invention includes multiple layers of platinum followed by one layer of $SiO_x$, where this series was repeated at least once. All layers were deposited by ALD. Generally, in a platinum forming cycle, the BPSG surface was exposed to a 5 second dose of MeCpPt (Me)$_3$ at room temperature from a bubbler to cover the BPSG surface. The ALD chamber was then purged with 50 SCCM of helium for 5 seconds. The platinum precursor on the BPSG surface was then exposed to 50 SCCM of oxygen ($O_2$) for 5 seconds. The oxygen is used to convert the platinum precursor to produce a layer of platinum of less than a monolayer. The ALD chamber was then purged again with 50 SCCM of helium for 5 seconds. This complete platinum formation cycle was repeated between twenty (20) and fifty-five (55) times.

In the $SiO_x$ formation portion of the process, a $SiO_x$ layer was then applied over the ALD formed platinum. Generally, in the $SiO_x$ formation cycle, the BPSG surface having platinum formed thereon was exposed to a dose of disilane ($Si_2H_6$) delivered to the ALD reaction chamber at 2.5 SCCM. The ALD chamber was then purged with 20 SCCM of helium for 5 seconds. The disilane and platinum formed on the BPSG surface were then exposed to 50 SCCM of oxygen ($O_2$) for 5 seconds. The oxygen is used to convert the disilane to produce the Pt—$SiO_x$ seed film. The ALD chamber was then purged again with 50 SCCM of helium for 5 seconds. The resulting platinum doped silicon oxide (e.g., Pt—$SiO_x$) seed film had a thickness from about 50 to about 150 Angstroms.

Platinum was then plated onto the resulting Pt—$SiO_x$ seed film. Electroplating was carried out using a direct current supply operating at approximately 0.01 A to approximately 0.08 A. A platinum plating mixture included $H_2Pt(OH)_6$ at a concentration sufficient to provide 12 grams of platinum per one liter of platinum plating solution. The pH of the platinum plating mixture was adjusted to approximately 11 with KOH.

The resulting electroplated Pt layer and Pt—$SiO_x$ seed film was then subject to a standard peel test. Scratches in a crosshatch pattern were first made in the electroplated Pt layer and Pt—$SiO_x$ seed film, where the scratches extended through both the electroplated Pt layer and the Pt—$SiO_x$ seed film. SCOTCH tape was then applied to the electroplated Pt layer and removed. Neither the electroplated Pt layer, nor the Pt—$SiO_x$ seed film, were removed from the BPSG substrate by the SCOTCH tape for thickness of less than about 500 angstroms of the Pt—$SiO_x$ seed film.

In addition to the standard peel test, the Pt—$SiO_x$ seed film was subject to a photoresist develop test. The Pt—$SiO_x$ seed film was immersed in positive photoresist developer at room temperature for 30 minutes. The Pt—$SiO_x$ seed film was then rinsed and examined. Visual inspection indicated that the Pt—$SiO_x$ seed film was not removed by exposure to the positive photoresist developer or as a result of the standard peel test.

Example 3

Process for ALD Formed Pt Seed Film

ALD carried out using the experimental test reactor (custom manufacture) operating under high vacuum. The platinum seed film was deposited on BPSG surfaces. The seed film was deposited on the BPSG surfaces at a wafer surface temperature of about 235 degrees Celsius.

The platinum seed film of the present invention was deposited by ALD. Generally, in the platinum forming cycle, the BPSG surface was exposed to a 5 second dose of MeCpPt (Me)$_3$ at room temperature from bubbler to cover the BPSG surface. The ALD chamber was then purged with 50 SCCM of helium for 5 seconds. The platinum precursor on the BPSG surface was then exposed to 50 SCCM of oxygen ($O_2$) for 5 seconds. The oxygen is used to convert the platinum precursor to produce a layer of platinum of less than a monolayer. The ALD chamber was then purged again with 50 SCCM of helium for 5 seconds. This complete platinum formation cycle was repeated between 50 and 200 times. The resulting platinum seed film had a thickness from about 50 to about 150 Angstroms.

Platinum was then plated onto the resulting Pt seed film. Electroplating was carried out using a direct current supply operating at approximately 0.01 A to approximately 0.08 A. A platinum plating mixture included $H_2Pt(OH)_6$ at a concentration sufficient to provide 12 grams of platinum per one liter of platinum plating solution. The pH of the platinum plating mixture was adjusted to approximately 11 with KOH.

The resulting electroplated Pt layer and Pt seed film were then subject to a standard peel test. Scratches in a crosshatch pattern were first made in the electroplated Pt layer and Pt seed film, where the scratches extended through both the electroplated Pt layer and the Pt seed film. SCOTCH tape was then applied to the electroplated Pt layer and removed. 100 percent of the platinum seed film failed the peel test, as the electroplated Pt layer was removed with the tape.

Example 4

Process for ALD Formed Pt—Rh Seed Film

ALD was carried out using the experimental test reactor (custom manufacture) operating under high vacuum. All seed films were deposited on BPSG surfaces. Seed films were deposited on the BPSG surfaces at a wafer surface temperature of about 100 degrees to about 115 degrees Celsius.

The Pt—Rh seed film of the present example includes multiple series of layers of rhodium and multiple series of layers of platinum, both of which are deposited by ALD. Generally, in the rhodium formation cycle, the BPSG surface was exposed to a 5 second dose of $CpRh(CO)_2$ so as to cover the BPSG surface. The ALD chamber was then purged with 50 SCCM of He for 5 seconds. The rhodium precursor was then exposed to 50 SCCM of oxygen ($O_2$) for 5 seconds. The resulting rhodium layer had less than a monolayer of coverage. A vacuum was then applied to the ALD chamber for 5 seconds. This complete rhodium formation cycle was repeated for a total of 5 times to form the series of rhodium layers.

In the platinum formation portion of the process, the series of platinum layers were then applied over the ALD formed rhodium. Generally, in a platinum formation cycle, the BPSG surface having rhodium formed thereon was exposed to a 5 second dose of $MeCpPt(Me)_3$ at room temperature from a bubbler. The ALD chamber was then purged with 50 SCCM of helium for 5 seconds. The platinum precursor and rhodium formed on the BPSG surface were then exposed to 50 SCCM of ozone ($O_3$) for 5 seconds. The resulting platinum layer had less than a monolayer of coverage. A vacuum was then applied to the ALD chamber for 5 seconds. This complete platinum formation cycle was repeated for a total of 30 times to form the series of platinum layers.

The protocol of depositing the rhodium layer series and the platinum layer series was repeated 9 times, so as to have a total of 180 cycles for both the rhodium precursor and the platinum precursor. The resulting seed film includes a sandwich like structure of platinum and rhodium, e.g., similar to a metal laminate, having a thickness from about 50 to about 150 Angstroms.

Platinum was then plated onto the resulting Pt—Rh seed film. Electroplating was carried out using a direct current supply operating at approximately 0.01 A to approximately 0.08 A. A platinum plating mixture included $H_2Pt(OH)_6$ at a concentration sufficient to provide 12 grams of platinum per one liter of platinum plating solution. The pH of the platinum plating mixture was adjusted to approximately 11 with KOH.

The resulting electroplated Pt layer and Pt—Rh seed film was then subject to a standard peel test. Scratches in a cross-hatch pattern were first made in the electroplated Pt layer and Pt—Rh seed film, where the scratches extended through both the electroplated Pt layer and the Pt—Rh seed film. SCOTCH tape was then applied to the electroplated Pt layer and removed. 100 percent of the Pt—Rh seed films tested were removed from the BPSG substrate by the SCOTCH tape.

A number of implementations and embodiments of the invention have been described. For instance, seed films for use in electroplating of metal layers in integrated circuit substrate assemblies have been described. The seed films are conformal to the structures of the substrate assemblies and allow for the electroplating of metal layers onto the substrate assemblies. The seed films may be utilized in a variety of substrate assembly structures such as where conductive layers that are both thin and conformal are desired. It is understood that various modifications can be made without departing from the scope of the invention. Accordingly, these and other embodiments are within the scope of the following claims.

What is claimed is:

1. An electroplating method for use in fabricating an integrated circuit, the method comprising:
    forming a seed film on at least a portion of a surface of a substrate assembly by atomic layer deposition, wherein the seed film comprises at least one noble metal and at least one conductive metal oxide, wherein the at least one noble metal comprises platinum, and further wherein the conductive metal oxide comprises at least one metal that is different than platinum, wherein forming a seed film comprises repeating one or more deposition cycles, wherein at least one of the one or more deposition cycles comprises:
        providing a predetermined amount of one or more noble metal containing precursors, and
        providing a reactant for use in converting the predetermined amount of the one or more noble metal precursors to less than a monolayer of at least a first noble metal; and
    further wherein at least another of the one or more deposition cycles comprises:
        providing a predetermined amount of at least one platinum containing precursor, and
        providing a component comprising oxygen for use in converting the predetermined amount of the at least one platinum containing precursor to less than a monolayer of platinum and for use in oxidizing at least a portion of the first noble metal; and
    electroplating a conductive layer over at least a portion of the seed film.

2. The electroplating method of claim 1, wherein the at least one conductive metal oxide comprises at least one noble metal oxide selected from a group consisting of iridium oxide, ruthenium oxide, and rhodium oxide.

3. The electroplating method of claim 2, wherein the at least one conductive metal oxide comprises rhodium oxide.

4. The electroplating method of claim 1, wherein the at least one noble metal comprises at least one noble metal selected from a group consisting of iridium, ruthenium, and rhodium.

5. The electroplating method of claim 1, wherein forming a seed film comprises forming the seed film with a thickness of no less than 20 angstroms and no greater than 500 angstroms.

6. The electroplating method of claim 1, wherein electroplating a conductive layer comprises forming at least a portion of an electrode of a capacitor structure using the seed film.

7. The electroplating method of claim 1, wherein electroplating a conductive layer over the seed film comprises:
    chemical vapor depositing conductive material over at least a portion of the seed film, and
    electroplating the conductive layer over the conductive material and the seed film.

8. The electroplating method of claim 1, wherein the surface of the substrate assembly defines an opening, wherein the opening is a small high aspect ratio opening having a critical dimension of less than about 1 micron and an aspect ratio greater than about 1.

9. The electroplating method of claim 1, wherein electroplating the conductive layer comprises electroplating a conductive layer comprising platinum over at least a portion of the seed film.

10. A plating method, comprising:
forming a seed film on a substrate assembly, wherein forming the seed layer comprises forming one or more noble metal layers and one or more conductive metal oxide layers on the substrate assembly, wherein each of the one or more noble metal layers and one or more conductive metal oxide layers is less than a monolayer, wherein the one or more noble metal layers comprise platinum, and further wherein the one or more conductive metal oxide layers comprise one or more metals different than platinum, wherein forming a seed film comprises repeating one or more deposition cycles, wherein at least one of the one or more deposition cycles comprises:
providing a predetermined amount of one or more noble metal containing precursors, and
providing a reactant for use in converting the predetermined amount of the one or more noble metal precursors to less than a monolayer of at least a first noble metal; and
wherein at least another of the one or more deposition cycles comprises:
providing a predetermined amount of at least one platinum containing precursor, and
providing a component comprising oxygen for use in converting the predetermined amount of the at least one platinum containing precursor to less than a monolayer of platinum and for use in oxidizing at least a portion of the first noble metal; and
plating a conductive layer over at least a portion of the seed film.

11. The plating method of claim 10, wherein the one or more conductive metal oxide layers comprise at least one noble metal oxide selected from a group consisting of iridium oxide, ruthenium oxide, and rhodium oxide.

12. The plating method of claim 11, wherein the one or more conductive metal oxide layers comprises rhodium oxide.

13. The plating method of claim 10, wherein the one or more noble metal layers comprises at least one noble metal selected from a group consisting of iridium, ruthenium, and rhodium.

14. The plating method of claim 10, wherein forming a seed film comprises forming the seed film with a thickness of no less than 20 angstroms and no greater than 500 angstroms.

15. The plating method of claim 10, wherein plating a conductive layer comprises forming at least a portion of an electrode of a capacitor structure using the seed film.

16. The plating method of claim 10, wherein plating a conductive layer over the seed film comprises:
chemical vapor depositing conductive material over at least a portion of the seed film, and
electroplating the conductive layer over the conductive material and the seed film.

17. The plating method of claim 10, wherein the surface of the substrate assembly defines an opening, wherein the opening is a small high aspect ratio opening having a critical dimension of less than about 1 micron and an aspect ratio greater than about 1.

18. The plating method of claim 10, wherein plating the conductive layer comprises electroplating a conductive layer comprising platinum over at least a portion of the seed film.

19. An electroplating method for use in fabricating an integrated circuit, the method comprising:
forming a seed film on at least a portion of a surface of a substrate assembly by atomic layer deposition, wherein the seed film comprises one or more layers comprising at least one noble metal and one or more layers comprising at least one conductive metal oxide, wherein the at least one noble metal comprises platinum, and further wherein the at least one conductive metal oxide comprises at least one metal that is different than platinum, wherein forming a seed film comprises repeating one or more deposition cycles, wherein at least one of the one or more deposition cycles comprises:
forming a plurality of layers of at least a first noble metal for use in providing the one or more layers comprising at least one conductive metal oxide, wherein forming each layer of the plurality of layers of at least a first noble metal comprises:
providing a predetermined amount of at least one noble metal containing precursors; and
providing a reactant for use in converting the predetermined amount of at least one noble metal containing precursors to a layer of at least a first noble metal; and
forming a plurality of layers of at least a second noble metal comprising platinum for use in providing the one or more layers comprising at least one noble metal, wherein forming each layer of the plurality of layers of at least a second noble metal comprises:
providing a predetermined amount of at least one platinum containing precursor; and
providing a component comprising oxygen for use in converting the predeteiinined amount of at least one platinum containing precursor to a layer of platinum and for use in oxidizing at least a portion of the plurality layers of at least a first noble metal; and
electroplating a conductive layer over at least a portion of the seed film.

20. The electroplating method of claim 19, wherein the at least one conductive metal oxide comprises at least one noble metal oxide selected from a group consisting of iridium oxide, ruthenium oxide, and rhodium oxide.

21. The electroplating method of claim 20, wherein the at least one conductive metal oxide comprises rhodium oxide.

22. The electroplating method of claim 19, wherein electroplating a conductive layer over the seed film comprises:
chemical vapor depositing conductive material over at least a portion of the seed film, and
electroplating the conductive layer over the conductive material and the seed film.

23. An electroplating method for use in fabricating an integrated circuit, the method comprising:
forming a seed film on at least a portion of a surface of a substrate assembly by atomic layer deposition, wherein the seed film comprises one or more layers comprising at least one noble metal and one or more layers comprising at least one conductive metal oxide, wherein the at least one noble metal comprises platinum, and further wherein the at least one conductive metal oxide comprises rhodium oxide, wherein forming a seed film comprises repeating one or more deposition cycles, wherein at least one of the one or more deposition cycles comprises:
forming a plurality of layers of at least a first noble metal for use in providing the one or more layers comprising at least one conductive metal oxide, wherein forming each of the plurality of layers of at least a first noble metal comprises:

providing a predetermined amount of at least one rhodium containing precursor; and providing a reactant for use in converting the predetermined amount of at least one rhodium precursor to a layer of at least a first noble metal; and forming a plurality of layers of at least a second noble metal comprising platinum for use in providing the one or more layers comprising at least one noble metal, wherein forming each of the plurality of layers of at least a second noble metal comprises:

providing a predetermined amount of at least one platinum containing precursor; and providing a component comprising ozone for use in converting the predetermined amount of at least one platinum containing precursor to a layer of platinum and for use in oxidizing at least a portion of the plurality of layers of at least a first noble metal; and electroplating a conductive layer over at least a portion of the seed film.

24. The electroplating method of claim 23, wherein the at least one conductive metal oxide comprises at least one noble metal oxide selected from a group consisting of iridium oxide and ruthenium oxide.

25. The electroplating method of claim 23, wherein the at least one noble metal comprises at least one noble metal selected from a group consisting of iridium and ruthenium.

* * * * *